United States Patent
Kurokawa et al.

(10) Patent No.: US 11,088,657 B2
(45) Date of Patent: Aug. 10, 2021

(54) VIBRATION ELEMENT, ELECTRONIC APPARATUS, AND VEHICLE

(71) Applicant: Seiko Epson Corporation, Tokyo (JP)

(72) Inventors: Kenichi Kurokawa, Suwa (JP); Yukio Kitahara, Chino (JP); Takashi Yamazaki, Shiojiri (JP); Akihiko Ebina, Fujimi (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/911,446

(22) Filed: Jun. 25, 2020

(65) Prior Publication Data

US 2020/0412299 A1     Dec. 31, 2020

(30) Foreign Application Priority Data

Jun. 26, 2019 (JP) .............................. JP2019-118291

(51) Int. Cl.
*H03B 5/32* (2006.01)
*H01L 41/047* (2006.01)
*H03H 9/15* (2006.01)

(52) U.S. Cl.
CPC ........... *H03B 5/32* (2013.01); *H01L 41/0472* (2013.01); *H01L 41/0477* (2013.01); *H03H 9/15* (2013.01)

(58) Field of Classification Search
CPC ... H03B 5/32; H01L 41/0472; H01L 41/0477; H03H 9/15
See application file for complete search history.

(56) References Cited

U.S. PATENT DOCUMENTS

2012/0194283 A1    8/2012  Funakawa et al.
2015/0022275 A1*   1/2015  Yamazaki ................ H03H 9/21
                                                        331/158

FOREIGN PATENT DOCUMENTS

| JP | 2009-302233 A | 12/2009 |
| JP | 2011-228922 A | 11/2011 |
| JP | 2013-062643 A | 4/2013 |
| JP | 2015-023434 A | 2/2015 |
| JP | 2019-022075 A | 2/2019 |

OTHER PUBLICATIONS

Atomic layer deposition of titanium nitride for quantum circuits, Appl. Phys. Lett. 113, 212601 (2018), Published Nov. 19, 2018, https://doi.org/10.1063/1.5053461, Abigail Shearrow, Gerwin Koolstra, Samuel J. Whiteley, Nathan Earnest . . . (Year: 2018).*

\* cited by examiner

*Primary Examiner* — Jeffrey M Shin
(74) *Attorney, Agent, or Firm* — Harness, Dickey & Pierce, P.L.C.

(57) ABSTRACT

A vibration element includes: a base; an arm continuous with the base; a first electrode that includes a first layer of titanium nitride and a second layer containing nitrogen, titanium, and oxygen, and is disposed on the arm; an aluminum nitride layer in contact with the second layer; and a second electrode disposed on the aluminum nitride layer.

7 Claims, 6 Drawing Sheets

VIBRATION ELEMENT, ELECTRONIC APPARATUS, AND VEHICLE

The present application is based on, and claims priority from JP Application Serial Number 2019-118291, filed Jun. 26, 2019, the disclosure of which is hereby incorporated by reference herein in its entirety.

BACKGROUND

1. Technical Field

The present disclosure relates to a vibration element, an electronic apparatus, and a vehicle.

2. Related Art

In the related art, JP-A-2015-23434 discloses a vibration element including a base, a vibrating arm extending from the base, a first electrode provided on the vibrating arm, a second electrode provided above the first electrode, a piezoelectric body disposed between the first electrode and the second electrode, and an insulating film disposed between the first electrode and the piezoelectric body. A material of the first electrode includes titanium nitride, a material of the insulating film includes silicon dioxide, and a material of the piezoelectric body includes aluminum nitride. The vibration element improves orientation of the piezoelectric body by forming the piezoelectric body on the insulating film including the silicon dioxide.

However, in the vibration element described in JP-A-2015-23434, since the insulating film is disposed between the first electrode and the piezoelectric body, it is difficult to apply an electric field to the piezoelectric body.

SUMMARY

A vibration element includes: a base; an arm continuous with the base; a first electrode that includes a first layer of titanium nitride and a second layer containing nitrogen, titanium, and oxygen, and is disposed on the arm; an aluminum nitride layer in contact with the second layer; and a second electrode disposed on the aluminum nitride layer.

An electronic apparatus includes: a vibration element including a base, an arm continuous with the base, a first electrode that includes a first layer of titanium nitride and a second layer containing nitrogen, titanium, and oxygen, and is disposed on the arm, an aluminum nitride layer in contact with the second layer, and a second electrode disposed on the aluminum nitride layer; an oscillation circuit that drives the vibration element; and a control circuit that operates based on a frequency signal output from the oscillation circuit.

A vehicle includes: a vibration element including a base, an arm continuous with the base, a first electrode that includes a first layer of titanium nitride and a second layer containing nitrogen, titanium, and oxygen, and is disposed on the arm, an aluminum nitride layer in contact with the second layer, and a second electrode disposed on the aluminum nitride layer; an oscillation circuit that drives the vibration element; and a control circuit that operates based on a frequency signal output from the oscillation circuit.

DESCRIPTION OF EXEMPLARY EMBODIMENTS

1. First Embodiment

Here, as an example of a vibration element, a vibration element using silicon (Si) as a base material will be described.

Figure 1:
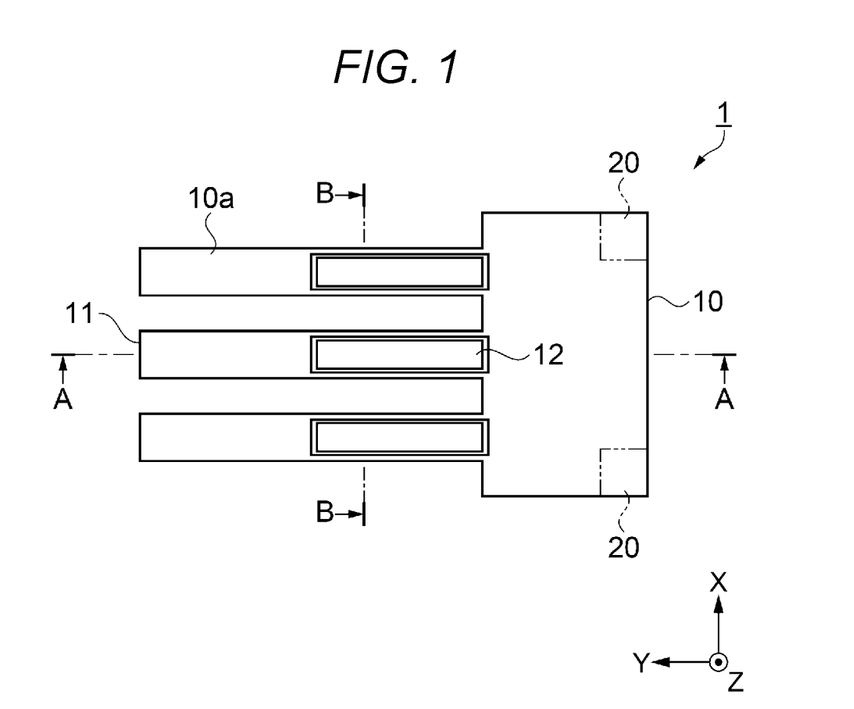
FIG. 1 is a plan view showing a schematic configuration of a vibration element according to a first embodiment.
Figure 2:
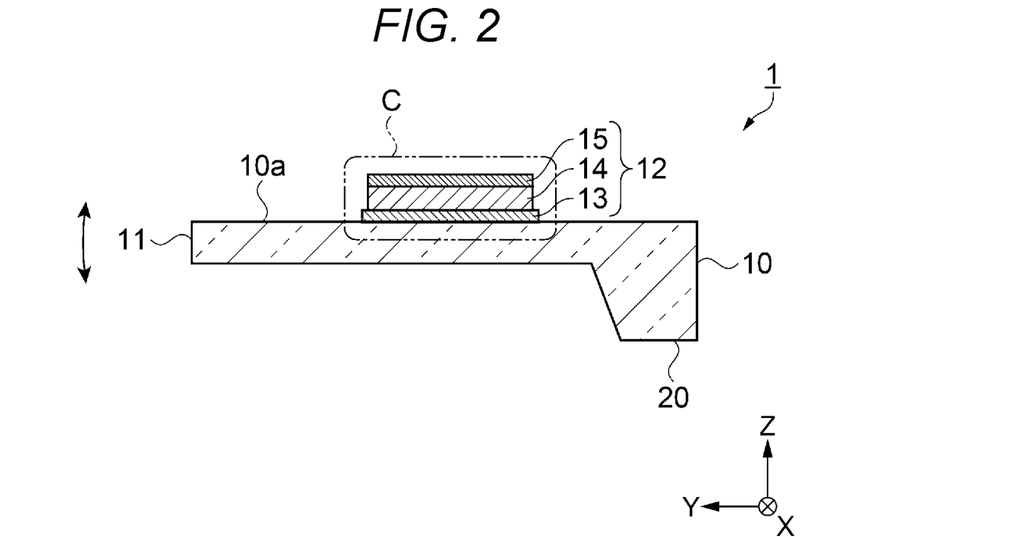
FIG. 2 is a cross-sectional view taken along line A-A of FIG. 1.
Figure 3:
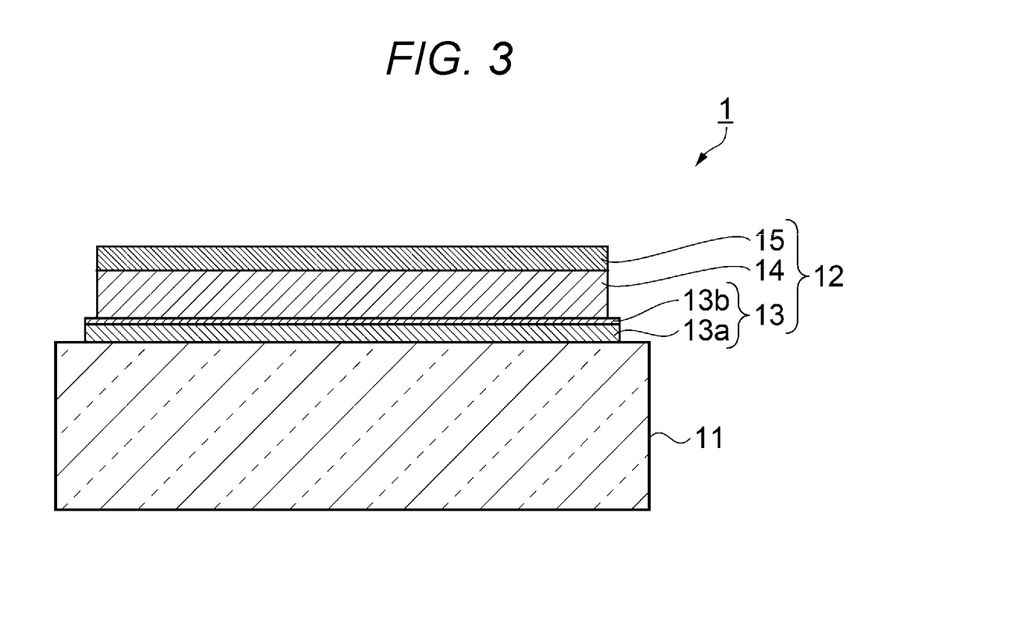
FIG. 3 is an enlarged view of a portion C in FIG. 2.
Figure 4:
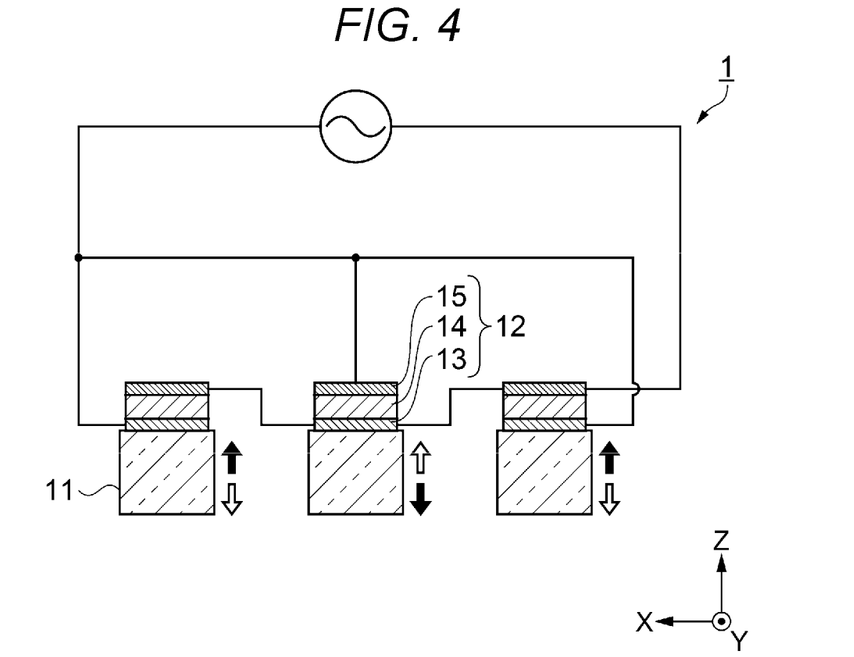
FIG. 4 is a cross-sectional view taken along line B-B of FIG. 1 and shows a wiring diagram of each excitation electrode.

FIG. 1 is a plan view showing a schematic configuration of a vibration element 1 according to a first embodiment. FIG. 2 is a cross-sectional view taken along line A-A of FIG. 1. FIG. 3 is an enlarged view of a portion C of FIG. 2. FIG. 4 is a cross-sectional view taken along line B-B of FIG. 1 and shows a wiring diagram of each excitation electrode 12. Wirings are omitted, and dimensional ratios of components are different from actual ones. In each figure, an X axis, a Y axis, and a Z axis are coordinate axes orthogonal to one another.

As shown in FIG. 1, the vibration element 1 includes, as a base material, a base 10, and three arms 11 that are coupled to the base 10 and that extend along the Y axis. In the present embodiment, a silicon substrate, for example, a polysilicon substrate, is used for the three arms 11 and the base 10.

The arms 11 each are formed in a substantially prismatic shape, and are arranged along the X axis in plan view, and the excitation electrode 12 is provided on each arm 11 on a main surface 10a along an XY plane specified by the X axis and the Y axis.

The arm 11 performs bending vibration, by the excitation electrode 12, along the Z axis orthogonal to the main surface 10a, that is, so-called out-of-plane vibration that vibrates in a direction not along the main surface 10a.

The base 10, the arms 11, and the excitation electrodes 12 are formed with high precision by using, for example, a sputtering technique, a photolithography technique, and an etching technique.

The excitation electrode 12 has a stacked structure including a first electrode 13 provided on a main surface 10a side, an aluminum nitride (AlN) layer 14 that is a piezoelectric body in contact with the first electrode 13, and a second electrode 15 disposed on the aluminum nitride layer 14.

As shown in FIG. 3, the first electrode 13 has a two-layer structure including a first layer 13a of titanium nitride (TiN) and a second layer 13b containing nitrogen (N), titanium (Ti), and oxygen (O). The first layer 13a is in contact with the main surface 10a of the arm 11, and the second layer 13b is in contact with the aluminum nitride layer 14.

The first electrode 13 configured with the first layer 13a of titanium nitride and the second layer 13b containing nitrogen, titanium, and oxygen has the same effect as an electrode configured with only titanium nitride, and has high conductivity. The second electrode 15 of the excitation electrode 12 is made of any one of titanium nitride, zirconium nitride (ZrN), niobium nitride (NbN), tantalum nitride (TaN), vanadium nitride (VN), hafnium nitride (HfN), chromium nitride (CrN), and molybdenum nitride (MoN). These materials have high conductivity and are therefore preferable as electrodes.

In the vibration element 1, from the viewpoint of obtaining good vibration characteristics, thickness of the first electrode 13 and the second electrode 15 of the excitation electrode 12 is preferably set to 10 nm or more and 30 nm or less. Thickness of the aluminum nitride layer 14 is preferably set to 100 nm or more and 1000 nm or less. Thickness of the second layer 13b containing nitrogen, titanium, and oxygen is preferably set to 0.1 nm or more and 10 nm or less, more preferably 1 nm or more and 5 nm or less.

When the thickness of the second layer 13b is less than 0.1 nm, an amount of oxygen which is contained in the second layer 13b and which is easily bonded to aluminum is small, so that the aluminum nitride layer 14 having high C axis orientation cannot be formed on the second layer 13b. When the thickness of the second layer 13b is larger than 10 nm, the amount of oxygen contained in the second layer 13b is large, and insulating property increases, so that an electric field applied to the aluminum nitride layer 14 is weakened, and the vibration characteristics may be deteriorated. If the thickness of the second layer 13b is 1 nm or more and 5 nm or less, better C axis orientation and vibration characteristics can be obtained.

The second layer 13b can be formed by applying an asking treatment with an oxygen gas to the first layer 13a of titanium nitride, and is amorphous. Since the second layer 13b is amorphous and contains oxygen, the piezoelectric body of the aluminum nitride layer 14 having high C axis orientation can be obtained. Specifically, during growing of the aluminum nitride layer 14 on the second layer 13b, when aluminum is sputtered in an nitrogen gas on the second layer 13b, oxygen in the second layer 13b and the aluminum are first bonded, and then the aluminum and nitrogen are bonded, so that crystal directions of the aluminum nitride layer 14 can be aligned. Therefore, the piezoelectric body of the aluminum nitride layer 14 having high C axis orientation can be formed on the second layer 13b.

The second layer 13b just needs to contain oxygen as a constituent element of the first layer 13a, and the second layer 13b may even be a layer in which the first layer 13a is formed of the same material as the second electrode 15, and an asking treatment is applied to the first layer 13a with an oxygen gas.

In order to obtain efficient vibration characteristics, it is preferable that the excitation electrode 12 extends from a boundary with the base 10 which is a root of the arm 11 toward a tip end, and has a length of about half of an entire length of the arm 11 which is a length from the root to the tip end of the arm 11 along the Y axis.

Thickness of the base 10 in the Z axis is formed to be larger than thickness of the arm 11 in the Z axis, as shown in FIG. 2.

As indicated by a two-dot chain line in FIG. 1, fixing portions 20 which are regions for fixing the vibration element 1 to an external member such as a package are provided on a back surface side of the main surface 10a at both ends along the X axis of the base 10. The fixing portion 20 is preferably provided at an end on an opposite side of the base 10 from the arm 11 side along the Y axis.

Here, operation of the vibration element 1 will be described.

As shown in FIG. 4, the excitation electrode 12 of the vibration element 1 is configured such that the first electrode 13 and the second electrode 15 are coupled to an AC power supply by a cross wiring, and an alternating voltage as a driving voltage is applied.

Specifically, the wiring is coupled such that the first electrode 13 of the central arm 11 and the second electrodes 15 of the arms 11 on both sides sandwiching the central arm 11 have the same potential, and the second electrode 15 of the central arm 11 and the first electrodes 13 of the arms 11 on both sides sandwiching the central arm 11 have the same potential.

In this state, when the alternating voltage is applied between the first electrode 13 and the second electrode 15, an electric field is generated between the first electrode 13 and the second electrode 15, the aluminum nitride layer 14 is polarized, distortion occurs in the aluminum nitride layer 14 due to a reverse piezoelectric effect, and the aluminum nitride layer 14 expands and contracts along the Y axis.

Due to the above-described cross wiring, the vibration element 1 is configured such that a direction of the electric field generated in the excitation electrode 12 of the central arm 11 and directions of the electric fields generated in the excitation electrodes 12 of the arms 11 on both sides sandwiching the central arm 11 are reversed, and expansion and contraction of the aluminum nitride layer 14 are reversed between the central arm 11 and the arms 11 on both sides.

Specifically, when the aluminum nitride layer 14 of the central arm 11 expands, the aluminum nitride layers 14 of the arms 11 on both sides sandwiching the central arm 11 contract. When the aluminum nitride layer 14 of the central arm 11 contracts, the aluminum nitride layers 14 of the arms 11 on both sides sandwiching the central arm 11 expand.

Due to the expansion and contraction of the aluminum nitride layer 14, in the vibration element 1, the arms 11 bend in directions of black arrows when the alternating voltage is at one potential, and the arms 11 bend in directions of white arrows when the alternating voltage is at the other potential.

By repeating the above bending, the arms 11 of the vibration element 1 perform bending vibration along the Z axis, that is, so-called out-of-plane vibration. At this time, the adjacent arms 11 perform bending vibration in opposite directions or opposite phases.

A degree of expansion and contraction of the aluminum nitride layer 14 increases as the C axis orientation becomes better.

As described above, since the second layer 13b in contact with the aluminum nitride layer 14 contains oxygen, the second layer 13b functions as a crystal orientation adjustment film, and the aluminum nitride layer 14 having high C axis orientation can be formed. Therefore, even if the insulating film containing silicon dioxide is not disposed between the first electrode 13 and the aluminum nitride layer 14, the vibration element 1 having good vibration characteristics can be obtained. Therefore, in the vibration element 1 of the present embodiment, since the aluminum nitride layer 14 which is a piezoelectric body in contact with the second layer 13b is disposed between the first electrode 13 and the second electrode 15 which have high conductivity, the electric field can be sufficiently applied to the aluminum nitride layer 14 as compared with a case where an insulating film is provided between the first electrode 13 and the aluminum nitride layer 14. Therefore, the arms 11 can be vibrated efficiently.

In addition to silicon, a Silicon on Insulator (SOI) or a quartz crystal may be used as the base material of the vibration element 1. In a case of SOI, the arm 11 is formed by a surface silicon layer, and a Buried Oxide (BOX) layer and a silicon layer below the arm 11 are etched to form the vibration element 1 having a structure in which a gap is provided below the arm 11.

The number of arms 11 of the vibration element 1 is not limited to three, and may be one, two, four, five, and n, and n is a natural number of six or more.

The thickness of the base 10 of the vibration element 1 may be the same as the thickness of the arm 11. Accordingly, since the vibration element 1 has a flat plate shape, the manufacturing is easy.

2. Second Embodiment

Figure 5:
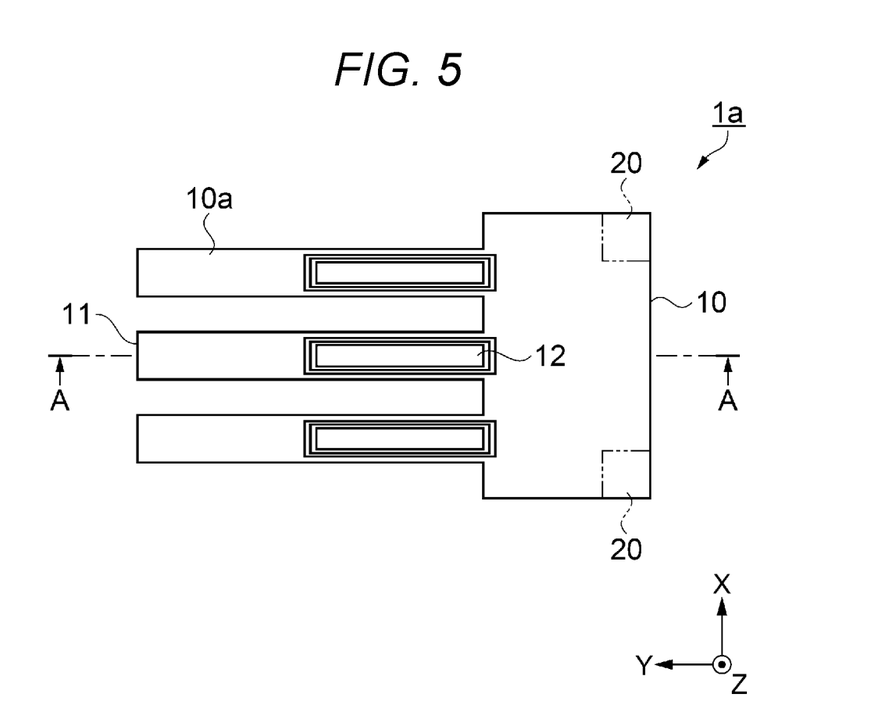
FIG. 5 is a plan view showing a schematic configuration of a vibration element according to a second embodiment.
Figure 6:
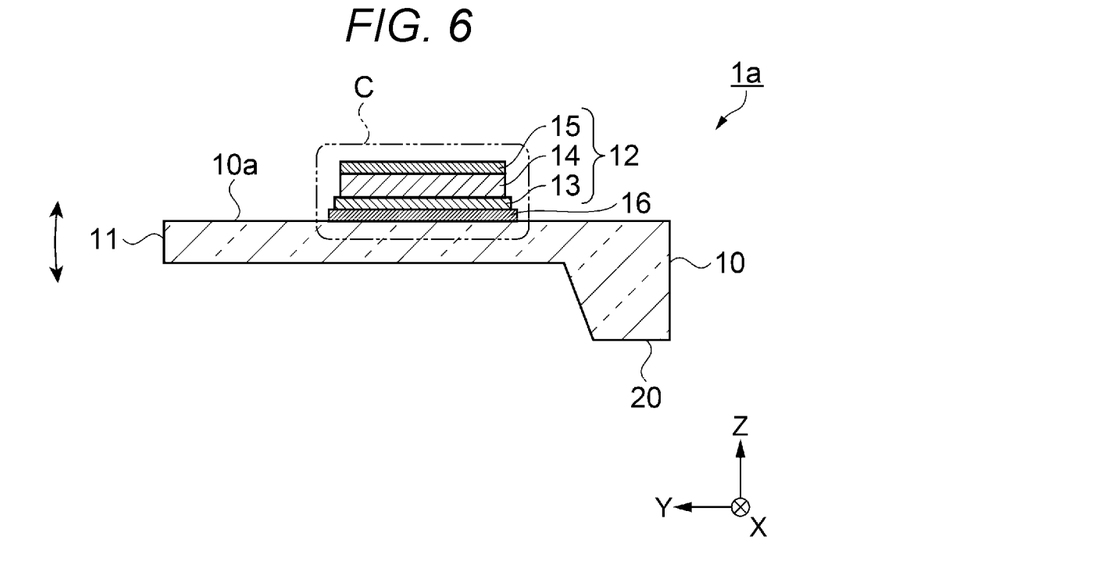
FIG. 6 is a cross-sectional view taken along line A-A of FIG. 5.
Figure 7:
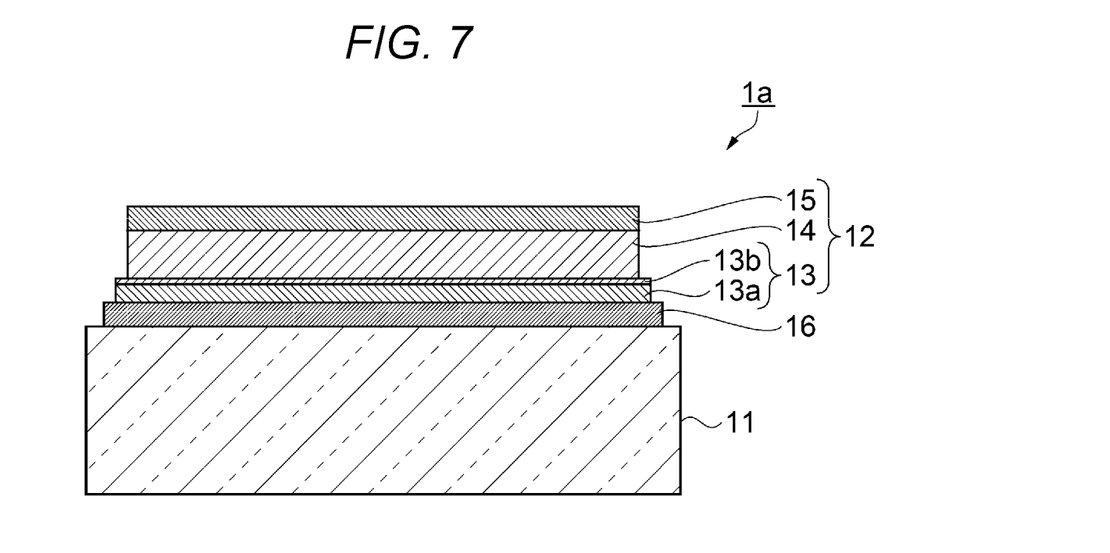
FIG. 7 is an enlarged view of a portion C in FIG. 6.

FIG. 5 is a plan view showing a schematic configuration of a vibration element 1a according to a second embodiment. FIG. 6 is a cross-sectional view taken along line A-A of FIG. 5. FIG. 7 is an enlarged view of a portion C of FIG. 6. The same components as those in the first embodiment are denoted by the same reference numerals and will not be described in detail, and differences from the first embodiment will be mainly described.

As shown in FIGS. 5, 6, and 7, the vibration element 1a according to the second embodiment differs from the first embodiment in a configuration around the excitation electrode 12.

In the vibration element 1a, a silicon dioxide ($SiO_2$) layer 16 is disposed between the main surface 10a of the arm 11 and the first electrode 13 of the excitation electrode 12.

The silicon dioxide layer 16 is formed with high precision by using, for example, a sputtering technique, a photolithography technique, and an etching technique. Thickness of the silicon dioxide layer 16 is preferably 100 nm or more and 300 nm or less.

According to such a configuration, since the vibration element 1a includes the silicon dioxide layer 16 provided between the main surface 10a of the arm 11 and the first electrode 13, the silicon dioxide layer 16 functions as a temperature characteristic correction film of the arm 11. That is, in the vibration element 1a, an inclination of a frequency-temperature characteristic of the arm 11 whose base material is Si is corrected or offset by an inclination of a frequency-temperature characteristic of the silicon dioxide layer 16, resulting in a flat frequency-temperature characteristic.

Accordingly, the vibration element 1a can prevent a change in frequency caused by a temperature change, and can improve the frequency-temperature characteristic.

The silicon dioxide layer 16 may be provided on a surface on an opposite side of the arm 11 from the main surface 10a side. With such a configuration, the vibration element 1a can also obtain the similar effect as described above.

3. Third Embodiment

Next, an electronic apparatus according to a third embodiment will be described with reference to FIG. 8. In the electronic apparatus, any one of the vibration elements 1 and 1a according to the above-described embodiments is mounted. Hereinafter, a configuration in which the vibration element 1 is applied will be described as an example.

Figure 8:
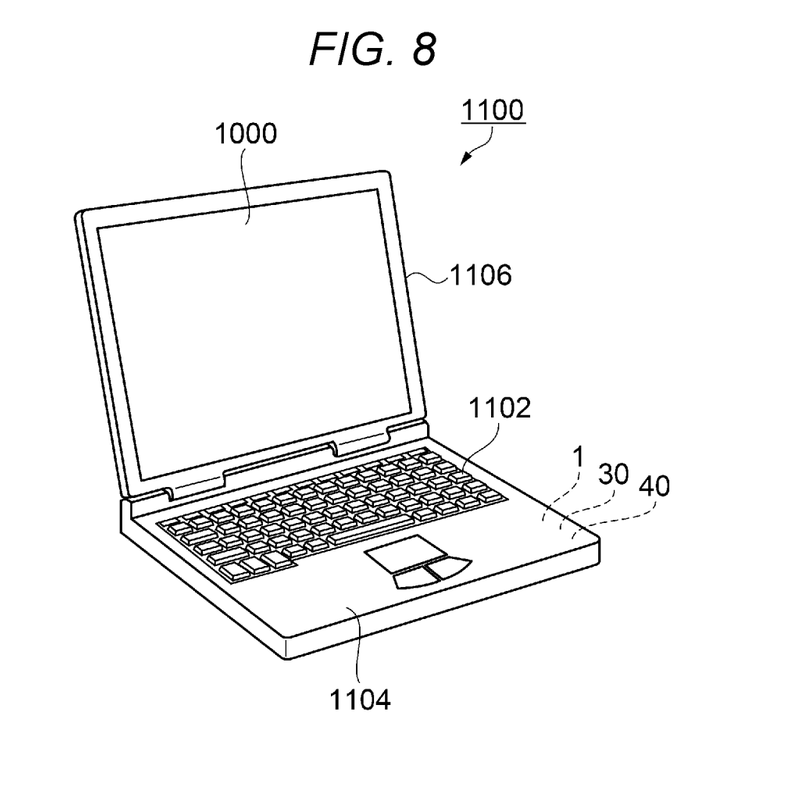
FIG. 8 is a perspective view showing a configuration of a notebook personal computer according to a third embodiment.

FIG. 8 is a perspective view schematically showing a configuration of a notebook personal computer 1100 as the electronic apparatus according to the present embodiment and the electronic apparatus includes the vibration element 1.

As shown in FIG. 8, the personal computer 1100 includes a main body 1104 including a keyboard 1102, and a display unit 1106 including a display 1000. The display unit 1106 is rotatably supported by the main body 1104 through a hinge structure. The vibration element 1 that functions as a reference clock or the like, an oscillation circuit 30 that drives the vibration element 1, and a control circuit 40 that operates based on a frequency signal output from the oscillation circuit 30 are incorporated in such a personal computer 1100.

As described above, by utilizing the vibration element 1 having excellent vibration characteristics in the electronic apparatus, it is possible to provide an electronic apparatus with higher performance.

The electronic apparatus on which any one of the vibration elements 1 and 1a of the above embodiments is mounted is not limited to the personal computer 1100. For example, the electronic apparatus can be applied to mobile terminals such as mobile phones, smartphones, and tablet terminals, wearable terminals such as clocks, and head-mounted displays, inkjet type ejection apparatuses, digital still cameras, televisions, video cameras, video tape recorders, pagers, electronic dictionaries, calculators, electronic game machines, workstations, television monitors for crime prevention, electronic binoculars, Point of Sales (POS) terminals, medical equipment such as electronic thermometers, sphygmomanometers, blood glucose meters, and electrocardiogram measurement devices, ultrasound diagnostic equipment, electronic endoscopes, fish finders, various measuring instruments, vehicle terminal base station equipment, flight simulators, and network servers.

4. Fourth Embodiment

Next, a vehicle according to a fourth embodiment will be described with reference to FIG. 9. In the vehicle, any one of the vibration elements 1 and 1a according to the above-described embodiments is mounted. Hereinafter, a configuration in which the vibration element 1 is applied will be described as an example.

Figure 9:
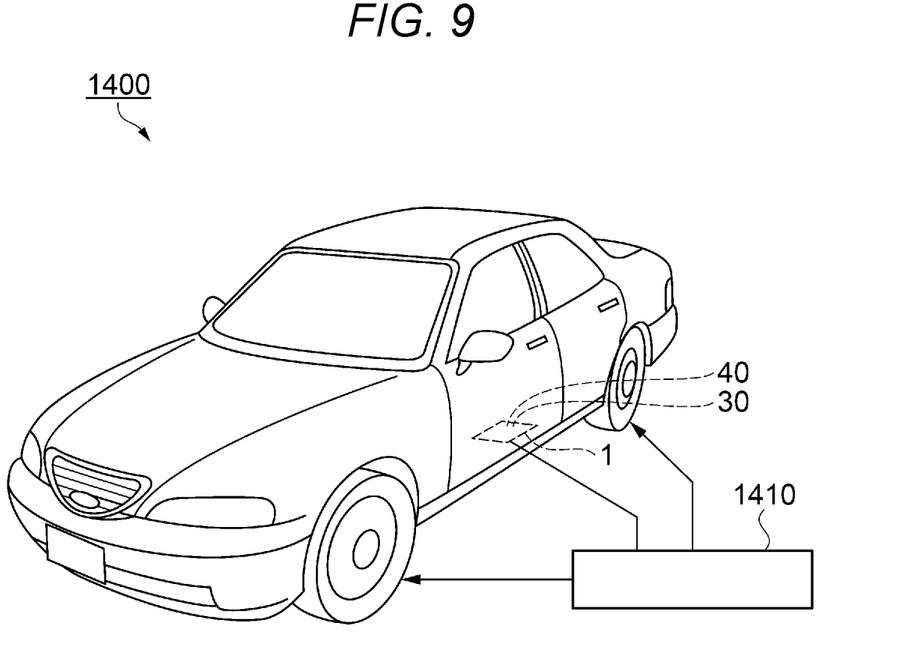
FIG. 9 is a perspective view showing a configuration of an automobile according to a fourth embodiment.

FIG. 9 is a perspective view schematically showing an automobile 1400 as a vehicle according to the present embodiment and the vehicle includes the vibration element 1.

As shown in FIG. 9, the automobile 1400 is equipped with the vibration element 1, the oscillation circuit 30 that drives the vibration element 1, and the control circuit 40 that operates based on a frequency signal output from the oscillation circuit 30. The control circuit 40 controls an Electronic Control Unit (ECU) 1410 such as a keyless entry, an immobilizer, a navigation system, an air conditioner, an Antilock Brake System (ABS), an airbag, a Tire Pressure Monitoring System (TPMS), an engine control, a battery monitor for hybrid automobiles and electric automobiles, and a body attitude control system.

As described above, by utilizing the vibration element 1 having excellent vibration characteristics in the vehicle, it is possible to provide a vehicle with higher performance.

The vehicle is not limited to the automobile 1400, and may be, for example, an aircraft, a ship, an Automated Guided Vehicle (AGV), a bipedal walking robot, an unmanned aircraft such as a drone or the like.

Contents derived from the embodiments will be described below.

A vibration element includes: a base; an arm continuous with the base; a first electrode that includes a first layer of titanium nitride and a second layer containing nitrogen, titanium, and oxygen, and is disposed on the arm; an aluminum nitride layer in contact with the second layer; and a second electrode disposed on the aluminum nitride layer.

According to the configuration, since the aluminum nitride layer which is a piezoelectric body in contact with the second layer is disposed between the first electrode and the second electrode which have high conductivity, the electric field can be sufficiently applied to the aluminum nitride layer as compared with a case where an insulating film is provided between the first electrode and the aluminum nitride layer. Therefore, the arm can be vibrated efficiently.

Since the second layer in contact with the aluminum nitride layer contains oxygen, the second layer functions as a crystal orientation adjustment film, and the aluminum nitride layer having high C axis orientation can be formed. Therefore, even if the insulating film containing silicon dioxide is not disposed between the first electrode and the aluminum nitride layer, the vibration element having good vibration characteristics can be obtained.

In the above vibration element, the second layer is preferably amorphous.

According to the configuration, since the second layer in contact with the aluminum nitride layer is amorphous and contains oxygen, when the aluminum nitride layer is grown on the second layer, crystal directions of the aluminum nitride layer can be aligned, and the aluminum nitride layer having high C axis orientation can be formed.

In the vibration element, thickness of the second layer is preferably 0.1 nm or more and 10 nm or less.

According to the configuration, since the thickness of the second layer is 0.1 nm or more and 10 nm or less, the aluminum nitride layer having high C axis orientation can be formed on the second layer.

In the vibration element, the second electrode is preferably any one of titanium nitride, zirconium nitride, niobium nitride, tantalum nitride, vanadium nitride, hafnium nitride, chromium nitride, and molybdenum nitride.

According to the configuration, since titanium nitride, zirconium nitride, niobium nitride, and tantalum nitride have high conductivity, the electric field can be sufficiently applied to the aluminum nitride layer by forming the second electrode with one of these.

The vibration element preferably includes a silicon dioxide layer disposed between the arm and the first electrode.

According to the configuration, since the vibration element includes a silicon dioxide layer disposed between the arm and the first electrode, the frequency-temperature characteristic of the vibration element is corrected by the frequency-temperature characteristic of the silicon dioxide layer, a change in frequency caused by the temperature change can be prevented, thereby improving the frequency-temperature characteristic.

An electronic apparatus includes: a vibration element including a base, an arm continuous with the base, a first electrode that includes a first layer of titanium nitride and a second layer containing nitrogen, titanium, and oxygen, and is disposed on the arm, an aluminum nitride layer in contact with the second layer, and a second electrode disposed on the aluminum nitride layer; an oscillation circuit that drives the vibration element; and a control circuit that operates based on a frequency signal output from the oscillation circuit.

According to the configuration, by utilizing the vibration element having excellent vibration characteristics in the electronic apparatus, it is possible to provide an electronic apparatus with higher performance.

A vehicle includes: a vibration element including a base, an arm continuous with the base, a first electrode that includes a first layer of titanium nitride and a second layer containing nitrogen, titanium, and oxygen, and is disposed on the arm, an aluminum nitride layer in contact with the second layer, and a second electrode disposed on the aluminum nitride layer; an oscillation circuit that drives the vibration element; and a control circuit that operates based on a frequency signal output from the oscillation circuit.

According to the configuration, by utilizing the vibration element having excellent vibration characteristics in the vehicle, it is possible to provide a vehicle with higher performance.

What is claimed is:

1. A vibration element comprising:
   a base;
   an arm continuous with the base;
   a first electrode that includes a first layer of titanium nitride, and a second layer containing nitrogen, titanium, and oxygen, and is disposed on the arm;
   an aluminum nitride layer in contact with the second layer; and
   a second electrode disposed on the aluminum nitride layer,
   wherein the second layer is configured to orient the aluminum nitride layer.

2. The vibration element according to claim 1, wherein the second layer is amorphous.

3. The vibration element according to claim 1, wherein thickness of the second layer is 0.1 nm or more and 10 nm or less.

4. The vibration element according to claim 1, wherein the second electrode is any one of titanium nitride, zirconium nitride, niobium nitride, tantalum nitride, vanadium nitride, hafnium nitride, chromium nitride, and molybdenum nitride.

5. The vibration element according to claim 1, further comprising:
   a silicon dioxide layer disposed between the arm and the first electrode.

6. An electronic apparatus comprising:
   a vibration element including
      a base,
      an arm continuous with the base,
      a first electrode that includes a first layer of titanium nitride, and a second layer containing nitrogen, titanium, and oxygen, and is disposed on the arm,
      an aluminum nitride layer in contact with the second layer, and
      a second electrode disposed on the aluminum nitride layer;
   an oscillation circuit that drives the vibration element; and
   a control circuit that operates based on a frequency signal output from the oscillation circuit,
   wherein the second layer is configured to orient the aluminum nitride layer.

7. A vehicle comprising:
   a vibration element including
      a base,
      an arm continuous with the base,
      a first electrode that includes a first layer of titanium nitride, and a second layer containing nitrogen, titanium, and oxygen, and is disposed on the arm,
      an aluminum nitride layer in contact with the second layer, and a second electrode disposed on the aluminum nitride layer;
an oscillation circuit that drives the vibration element; and
a control circuit that operates based on a frequency signal output from the oscillation circuit,
wherein the second layer is configured to orient the aluminum nitride layer.

\* \* \* \* \*